US008276537B2

(12) United States Patent
Katamura et al.

(10) Patent No.: US 8,276,537 B2
(45) Date of Patent: Oct. 2, 2012

(54) METHOD FOR MANUFACTURING SEMICONDUCTOR DEVICE AND SEMICONDUCTOR MANUFACTURING APPARATUS

(75) Inventors: Yukio Katamura, Mie-ken (JP); Yasuo Tane, Mie-ken (JP); Atsushi Yoshimura, Kanagawa-ken (JP); Fumihiro Iwami, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/008,443

(22) Filed: Jan. 18, 2011

(65) Prior Publication Data
US 2011/0263131 A1    Oct. 27, 2011

(30) Foreign Application Priority Data
Apr. 23, 2010   (JP) ................................. 2010-100311

(51) Int. Cl.
*H01L 21/30* (2006.01)
(52) U.S. Cl. ..... 118/46; 118/50; 118/326; 257/E21.211; 438/758
(58) Field of Classification Search ............ 118/50, 118/600, 46, 58, 59, 61, 318, 326; 257/E21.211; 438/758; 427/99.4, 207.1
See application file for complete search history.

(56) References Cited

U.S. PATENT DOCUMENTS
6,656,281 B1 * 12/2003 Ueda et al. .................... 118/695
2008/0290497 A1 * 11/2008 Sugaya et al. ................ 257/700

FOREIGN PATENT DOCUMENTS
JP         2008-288571        11/2008
JP         2009-111340         5/2009
WO    WO2009117345 A2 *      9/2009

OTHER PUBLICATIONS
U.S. Appl. No. 13/092,523, filed Apr. 22, 2011, Hara et al.

* cited by examiner

*Primary Examiner* — Julio J Maldonado
*Assistant Examiner* — Daniel Shook
(74) *Attorney, Agent, or Firm* — Oblon, Spivak, McClelland, Maier & Neustadt, L.L.P.

(57) ABSTRACT

In one embodiment, a method for manufacturing a semiconductor device is disclosed. The method can include, upon attaching a bonding material containing a resin and a solvent to a second surface opposed to a first surface including a circuit pattern of a wafer, heating the bonding material to evaporate the solvent and decreasing vapor pressure of the solvent in an atmosphere faced with the bonding material and heating the attached bonding material to form a bonding layer.

9 Claims, 3 Drawing Sheets

| UPON ATTACHING A BONDING MATERIAL TO THE REAR SURFACE OF A WAFER OR DICED WAFER, HEAT THE BONDING MATERIAL TO EVAPORATE SOLVENT, AND DECREASE THE VAPOR PRESSURE OF THE SOLVENT IN THE ATMOSPHERE FACED WITH THE BONDING MATERIAL | ~S1 |
| CONVERT THE ATTACHED BONDING MATERIAL TO B-STAGE TO FORM A BONDING LAYER | ~S2 |
FIG. 1
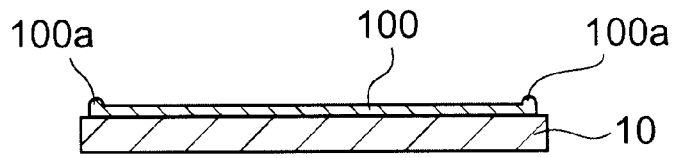
FIG. 2A
FIG. 2B
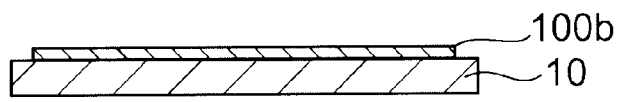
FIG. 2C

METHOD FOR MANUFACTURING SEMICONDUCTOR DEVICE AND SEMICONDUCTOR MANUFACTURING APPARATUS

CROSS-REFERENCE TO RELATED APPLICATIONS

This application is based upon and claims the benefit of priority from the prior Japanese Patent Application No. 2010-100311, filed on Apr. 23, 2010; the entire contents of which are incorporated herein by reference.

FIELD

Embodiments described herein relate generally to a method for manufacturing a semiconductor device and a semiconductor manufacturing apparatus.

BACKGROUND

There is known a method for jetting a bonding material from a noncontact applicator toward the rear surface of a semiconductor element (the surface opposed to the surface including a circuit pattern). Furthermore, bonding materials to be jetted from the noncontact applicator are proposed.

Here, if protrusions and depressions exist on the front surface of the bonding layer formed by the applied bonding material, then when the semiconductor element is bonded to a base material, air may be taken in and generate a void. Thus, there is proposed a method for suppressing the occurrence of protrusions and depressions on the front surface of the bonding layer by adding a surface conditioner to the bonding material (see JP-A-2009-111340).

However, there are limitations to flattening the front surface of the bonding layer by selecting the type and added amount of the surface conditioner.

BRIEF DESCRIPTION OF THE DRAWINGS

FIG. 1 is a flow chart for illustrating the formation of a bonding layer;

FIGS. 2A to 2C are schematic views for illustrating the attachment of a bonding material;

DETAILED DESCRIPTION

Figure 3A:
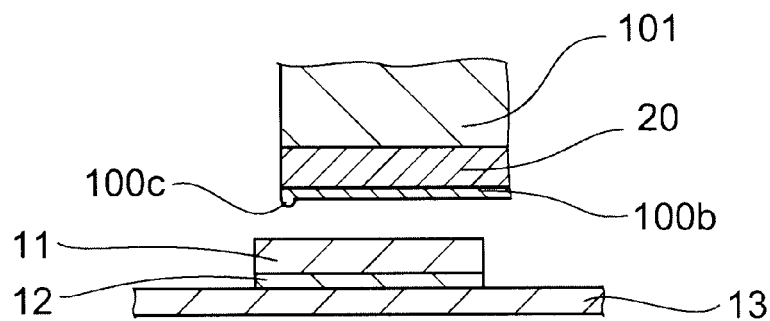
FIGS. 3A and 3B are schematic views for illustrating bonding using a bonding layer having a protrusion.

In general, according to one embodiment, a method for manufacturing a semiconductor device is disclosed. The method can include, upon attaching a bonding material containing a resin and a solvent to a second surface opposed to a first surface including a circuit pattern of a wafer, heating the bonding material to evaporate the solvent, decreasing vapor pressure of the solvent in an atmosphere faced with the bonding material and heating the attached bonding material to form a bonding layer.

In general, according to one embodiment, a semiconductor manufacturing apparatus includes a mounting section, a jetting section, a heating section and a vapor pressure controller. The mounting section is configured to mount a wafer. The jetting section is configured to jet a bonding material containing a resin and a solvent toward the wafer. The heating section is configured to heat the bonding material attached in a film form onto the wafer and the vapor pressure controller is configured to decrease vapor pressure of the solvent in an atmosphere faced with the bonding material attached in the film form onto the wafer.

Embodiments of the invention will now be illustrated with reference to the drawings. In the drawings, similar components are labeled with like reference numerals, and the detailed description thereof is omitted as appropriate.

Here, in the process for manufacturing a semiconductor device, the so-called upstream process includes the forming a circuit pattern on a wafer surface by film formation, resist application, exposure, development, etching, and resist removal, the inspection, the cleaning, the heat treatment, the impurity doping step, the diffusion, and the planarization. Furthermore, the so-called downstream process includes the assembly including dicing, mounting, bonding, and sealing, and the inspection for inspecting functionality and reliability.

In the method for manufacturing a semiconductor device according to an embodiment, a noncontact applicator is used to form a bonding layer having a flattened front surface (the surface opposite to the side in contact with the semiconductor element) on the rear surface (the surface opposed to the surface including a circuit pattern) of the semiconductor element (wafer).

Unless otherwise noted, the term "flattened bonding layer and bonding material" used herein refers to "bonding layer and bonding material whose surface opposite to the side in contact with the semiconductor element is nearly flat". The "front surface of the bonding layer and bonding material" refers to the "surface opposite to the side in contact with the semiconductor element".

In the mounting, the formed bonding layer is used to bond the semiconductor element to the base material. Except for forming the flattened bonding layer, known methods are applicable, and hence the detailed description of each of the aforementioned processes is omitted.

FIG. 1 is a flow chart for illustrating the formation of a bonding layer.

FIG. 2A is a schematic view for illustrating the attachment of a bonding material according to a comparative example. FIG. 2B is a schematic view for illustrating the attachment of a bonding material according to this embodiment. FIG. 2C is a schematic view for illustrating the formation of a bonding layer according to this embodiment.

First, the bonding layer according to the comparative example is illustrated.

As illustrated in FIG. 2A, a noncontact applicator is used to attach a bonding material in the form of a generally circular film to the rear surface of a wafer 10. Then, a thin film 100 with a protrusion 100a at the periphery is formed. Here, the protrusion 100a is not limited to being formed on all sides of the periphery, but may be formed on a part of side. In this state, the bonding material can be converted to the B-stage to form a bonding layer, and the wafer can be diced to form a semiconductor element. Then, a semiconductor element 20 with the bonding layer formed on the rear surface can be obtained. However, on the rear surface of the semiconductor element 20 located in the peripheral portion of the wafer 10, a bonding layer 100b with a protrusion 100c is formed accordingly (see FIG. 3A).

Figure 3B:
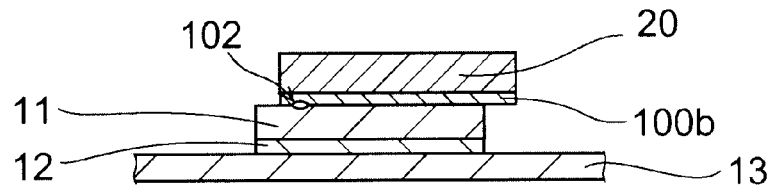

FIGS. 3A and 3B are schematic views for illustrating bonding using a bonding layer having a protrusion.

More specifically, FIG. 3A is a schematic view for illustrating bonding on another semiconductor element, and FIG. 3B is a schematic view for illustrating the generation of a void.

As shown in FIG. 3A, a semiconductor element 11 is bonded to a prescribed position of a substrate 13 via a bonding layer 12. When a semiconductor element 20 is bonded onto this semiconductor element 11 via a bonding layer 100b, the semiconductor element 20 is held by a mount collet 101, and heated and pressure bonded on the semiconductor element 11.

Here, if the bonding layer 100b has a protrusion 100c, then when the semiconductor element 20 is pressure bonded, air may be taken in and generate a void 102 as shown in FIG. 3B. The generation of such a void 102 may cause trouble such as the decrease of bonding strength. Here, FIGS. 3A and 3B illustrate the case where the semiconductor element 20 is bonded onto another semiconductor element 11. However, the danger of generating a void 102 still remains also in the case where the semiconductor element 20 is bonded to other base materials such as a substrate 13 or a lead frame.

The generation of such a void 102 can be suppressed by avoiding the formation of the protrusion 100c. Here, the inventors have found that the formation of the protrusion 100c can be suppressed by the following method. When the bonding material is attached in a film form, the bonding material is heated to evaporate the solvent, and the vapor pressure of the solvent in the atmosphere faced with the bonding material is decreased.

Next, returning to FIG. 1, the formation of the bonding layer according to this embodiment is illustrated.

First, when a noncontact applicator is used to attach a bonding material in a film form to the rear surface of a wafer 10, the bonding material is heated to evaporate the solvent, and the vapor pressure of the solvent in the atmosphere faced with the bonding material is decreased (step S1).

Here, the front surface of the wafer 10 includes a circuit pattern formed in the so-called upstream process.

That is, to the second surface opposed to the first surface including the circuit pattern of the wafer 10, a bonding material containing a resin and a solvent is attached in a film form. Furthermore, the bonding material is heated to evaporate the solvent, and the vapor pressure of the solvent in the atmosphere faced with the bonding material is decreased.

Here, preferably, the vapor pressure of the solvent in the atmosphere faced with the bonding material is made lower than the saturated vapor pressure.

To heat the bonding material attached in a film form, heating means such as a heater can be used. For instance, the wafer can be mounted on a mounting section including a heater, and the bonding material can be heated via the wafer.

In this case, the heating temperature (the temperature of the mounting section) can be set to e.g. 50° C. or more and 100° C. or less.

Means for decreasing the vapor pressure of the solvent in the atmosphere faced with the bonding material can be, e.g., means for removing the vapor of the solvent in the atmosphere faced with the bonding material to decrease the vapor pressure of the solvent. For instance, the vapor of the solvent can be removed by producing airflow in the atmosphere faced with the bonding material. Alternatively, the vapor of the solvent can be removed by changing the pressure in the atmosphere faced with the bonding material. Such means can be, e.g., air blowing means such as a fan, or means for pushing away the vapor of the solvent, such as injecting a pressurized gas with flow rate regulation. Alternatively, the vapor of the solvent can be pulled away by exhaust means such as a ventilating fan and an exhaust pump.

If an excessive airflow is produced in the atmosphere faced with the bonding material, there is a danger that the temperature of the heated bonding material decreases. Thus, the means for producing airflow is preferably capable of suppressing the temperature decrease of the heated bonding material. Such means can be, e.g., a hot air fan or a gas injector equipped with heating means.

The vapor pressure of the solvent in the atmosphere faced with the bonding material varies with the type of the solvent. Hence, the amount of air blowing, the amount of injection, and the amount of gas exhaust are adjusted as necessary. Thus, it is preferable that the amount of air blowing, the amount of injection, and the amount of gas exhaust can be controlled. Here, the relation of the vapor pressure of the solvent in the atmosphere faced with the bonding material to the amount of air blowing, the amount of injection, and the amount of gas exhaust can be previously determined by experiments. Based on this relation, the amount of air blowing, the amount of injection, and the amount of gas exhaust can be controlled.

The bonding material can be, e.g., a bonding material containing a resin as a solute, and a solvent.

The resin can be, e.g., an insulating resin. The insulating resin can be, e.g., a thermosetting resin or a thermoplastic resin. Here, in view of bondability and heat resistance, the resin is preferably a thermosetting resin such as epoxy resin, acrylic resin, urethane resin, and silicone resin, and more preferably epoxy resin. The epoxy resin can be, e.g., bisphenol A epoxy resin, bisphenol F epoxy resin, or novolac epoxy resin. Here, these resins may be used singly, or used as a mixture of two or more thereof.

The solvent can be suitably selected from those capable of dissolving the solute resin. For instance, the solvent can be γ-butyrolactone (GBL), cyclohexanone, or isophorone. Here, these solvents may be used singly, or used as a mixture of two or more thereof. Furthermore, a known curing accelerator, catalyst, filler, or coupling agent can be added thereto as necessary.

Furthermore, an additive having the action of suppressing the surface tension difference (leveling action) can be added. By adding such an additive, the formation of the protrusion 100c in forming the bonding layer can be further suppressed. The additive having the action of suppressing the surface tension difference can be, e.g., a silicone surface conditioner, an acrylic surface conditioner, or a vinyl surface conditioner. Here, it is preferable to use the silicone surface conditioner having a significant effect of equalizing the surface tension.

Methods for using a noncontact applicator to attach the bonding material in a film form can include, e.g., the ink jet method and the spray method. Methods for using a contact applicator to attach the bonding material in a film form can include, e.g., the roll coater method and the screen printing method.

Here, it is preferable to use the ink jet method or the spray method by which the bonding material can be attached in a film form without contact with the semiconductor element. It is more preferable to use the ink jet method by which a thin film with a uniform thickness can be formed.

In this case, for instance, the solute of the bonding material is epoxy resin, the solvent is γ-butyrolactone (GBL), the proportion of epoxy resin in the bonding material is 25 wt %, and the thickness of the bonding material attached in a film form is approximately 1 μm (micrometer). Then, the temperature of the mounting section can be set to approximately 75° C., and the amount of air blowing can be set to approximately 30 m$^3$/min.

The thickness (film thickness) of the bonding material attached in a film form is not limited. However, in view of the evaporation of the solvent described later, the film thickness of the bonding material is preferably set to 1 μm (micrometer)

or less for a single application. Furthermore, if the thickness of the bonding material attached in a film form is set to 1 μm (micrometer) or less, the formation of the protrusion can also be effectively suppressed.

By using the application method of this step S1, as illustrated in FIG. 2B, a noncontact applicator is used to attach a bonding material in a film form to the rear surface of a wafer 10. Thus, the formation of the protrusion 100a at the periphery can be suppressed.

Next, the bonding material attached in a film form is converted to the B-stage to form a bonding layer (step S2).

When the bonding material is converted to the B-stage, for instance, the wafer or the diced wafer is put into an oven, and the bonding material attached in a film form is heated to evaporate the solvent. Then, the thin film 100 with no (low) protrusion 100a at the periphery is converted to the B-stage to form a bonding layer. Consequently, as illustrated in FIG. 2C, a bonding layer 100b with no (low) protrusion 100c can be formed on the rear surface of the semiconductor element 20 located in the peripheral portion of the wafer 10.

The viscosity of the bonding layer (the degree of curing of the bonding layer) is suitably adjusted by the heating temperature and heating time. For instance, if the viscosity of the bonding layer is too high, bonding to the base material is made difficult. On the other hand, if the viscosity of the bonding layer is too low, misalignment may occur in bonding to the base material. Here, also in the case where the bonding layer is heated in the mounting to adjust the viscosity, the viscosity of the bonding layer is preferably set so as to facilitate the adjustment in the mounting.

Thus, a bonding layer can be formed on the rear surface of the wafer 10.

To thicken the thickness of the bonding layer, the aforementioned procedure can be repeated to form a bonding layer as stacked layers.

Thus, by dicing the wafer 10 with the bonding layer formed on the rear surface, a semiconductor element with the bonding layer formed on the rear surface can be obtained. The semiconductor element with the bonding layer formed on the rear surface is bonded to a base material via the bonding layer in the mounting, and subjected to bonding, sealing, and inspection for functionality and reliability.

In the foregoing example, the wafer 10 with the bonding layer formed on the rear surface is diced to obtain a semiconductor element with the bonding layer formed on the rear surface. However, this embodiment is not limited thereto. For instance, a semiconductor element with the bonding layer formed on the rear surface can be obtained also by performing the so-called pre-dicing and forming a bonding layer on the rear surface of the diced wafer 10. Alternatively, the wafer 10 may be diced after forming a bonding layer so as to avoid the dicing line of the wafer 10.

In the method for manufacturing a semiconductor device according to this embodiment, when the bonding material is attached to the rear surface of the wafer 10, the bonding material attached in a film form can be heated to evaporate the solvent, and the vapor pressure of the solvent in the atmosphere faced with the bonding material can be decreased.

Here, forming a bonding layer on the rear surface of a semiconductor element by using the ink jet method corresponds to forming a die attach film (hereinafter also referred to as "DAF") on the rear surface of a semiconductor element. However, forming a bonding layer by using the ink jet method is a method different from laminating a completed DAF to the rear surface of a semiconductor element. In the ink jet method, the viscosity of the bonding material needs to be decreased to prevent clogging of the jetting nozzle. Because the bonding material with low viscosity behaves as liquid, the end portion of the attached bonding material tends to rise. Increasing the viscosity of this bonding material after attachment to the semiconductor element can be achieved by effectively volatilizing the solvent of the bonding material.

This embodiment can facilitate evaporation of the solvent and suppress the formation of a bonding layer 100b having a protrusion 100c on the rear surface of the semiconductor element 20 located in the peripheral portion of the wafer 10. Alternatively, in the case where the bonding material is attached after singulation of the wafer 10, this embodiment can suppress the formation of a bonding layer 100b having a protrusion 100c on the rear surface of the semiconductor element 20. Changes in the composition and use condition of the bonding material can be rapidly and easily responded by suitably changing the heating temperature, the heating time, the amount of air blowing, the amount of injection, and the amount of gas exhaust. That is, complication of the process for forming the bonding layer can be suppressed, and the surface of the bonding layer can be flattened. Consequently, the generation of a void 102 can be suppressed when the semiconductor element is bonded to a base material via the bonding layer.

Furthermore, if the thickness of the bonding material attached in a film form is set to approximately 1 μm (micrometer) or less, the formation of the protrusion 100c can be effectively suppressed when the bonding material is converted to the B-stage. Furthermore, if an additive having the action of suppressing the surface tension difference is added to the bonding material, the formation of the protrusion 100c in converting the bonding material to the B-stage can be further suppressed.

Next, a semiconductor manufacturing apparatus according to this embodiment is illustrated.

Figure 4:
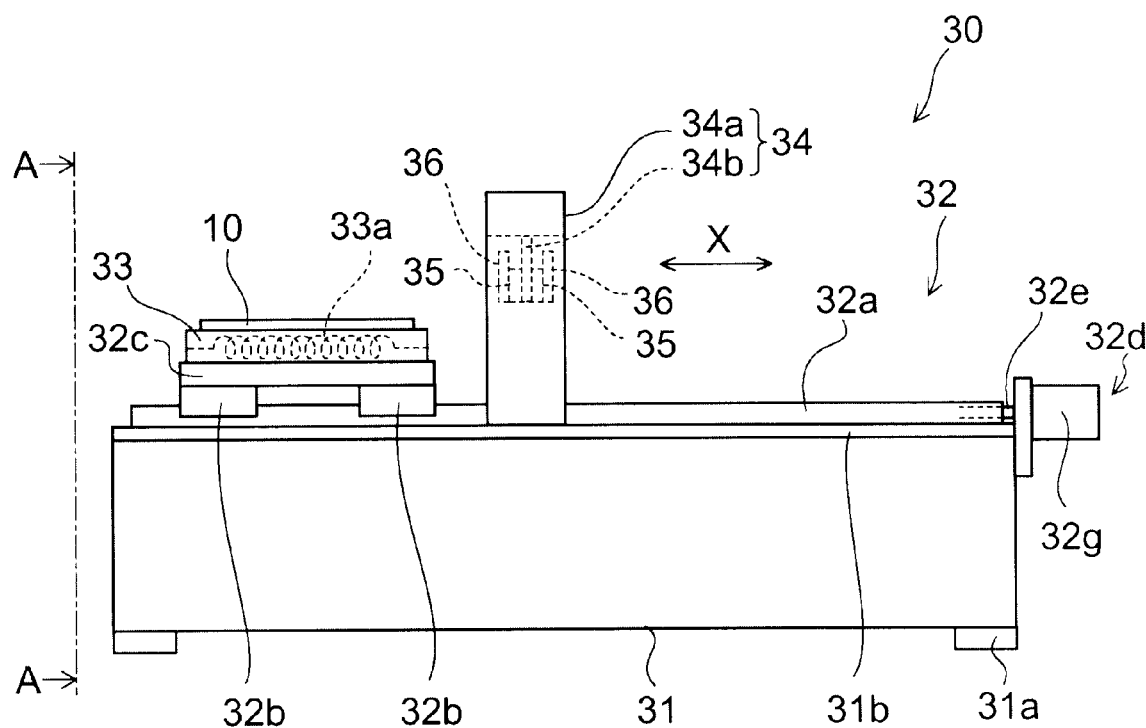
FIGS. 4 to 6 are schematic views for illustrating a semiconductor manufacturing apparatus according to this embodiment.
Figure 5:
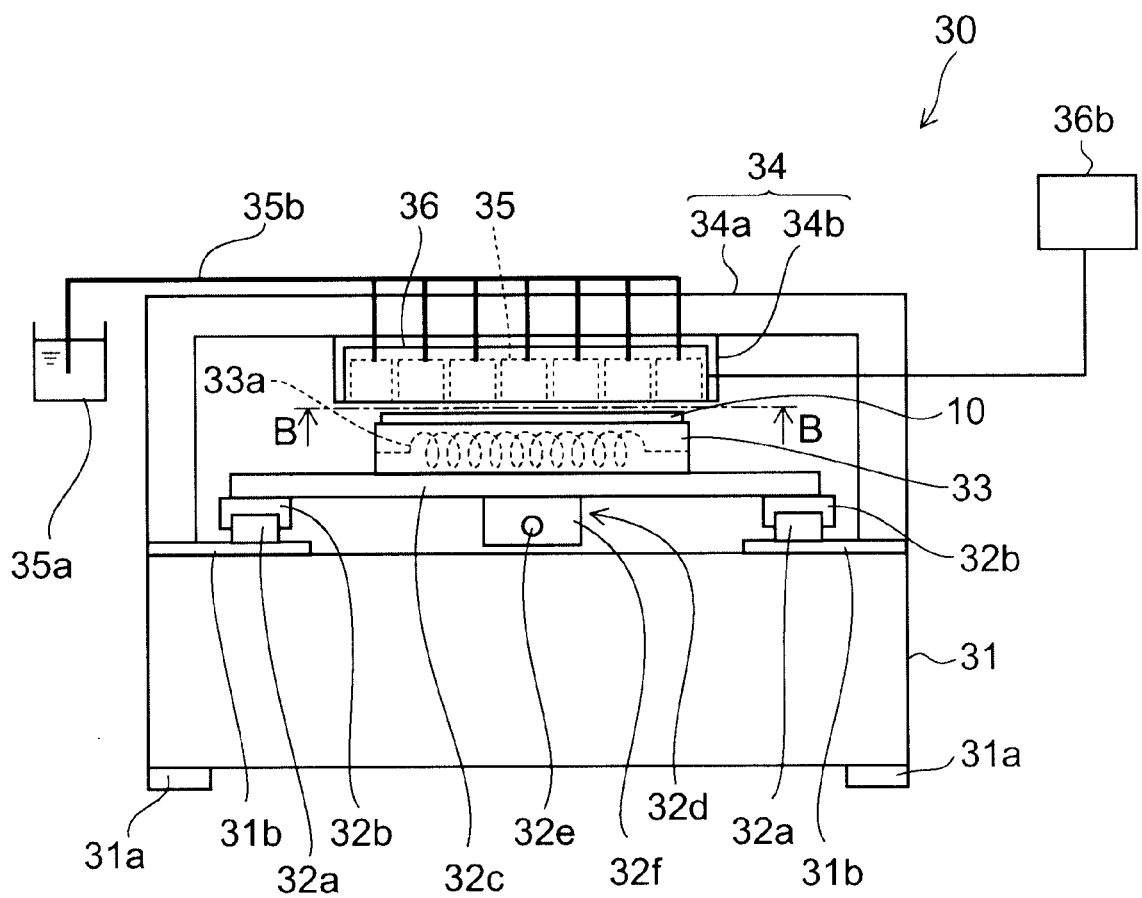
Figure 6:
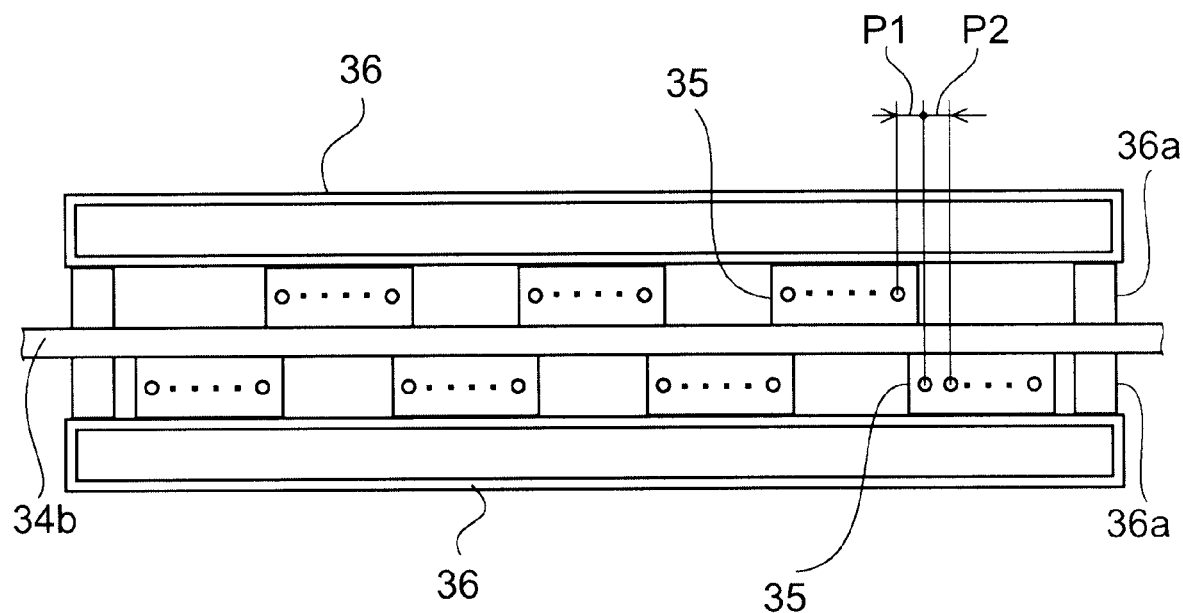

FIGS. 4 to 6 are schematic views for illustrating a semiconductor manufacturing apparatus according to this embodiment.

Here, FIG. 5 is a schematic view taken in the direction of arrows A-A in FIG. 4, and FIG. 6 is a schematic view taken in the direction of arrows B-B in FIG. 5.

As shown in FIGS. 4 and 5, the semiconductor manufacturing apparatus 30 includes a platform 31, a moving section 32, a mounting section 33, a support 34, a jetting section 35, and a vapor pressure controller 36.

The platform 31 is shaped like a generally rectangular solid, and legs 31a are provided on the bottom surface of the platform 31. A base plate 31b is provided on the surface opposed to the bottom surface.

The moving section 32 includes track rails 32a, a moving block 32b, an attachment unit 32c, and a driving unit 32d.

The track rail 32a has a generally rectangular cross-sectional shape and is provided on the upper surface of the base plate 31b. The track rail 32a extends in the longitudinal direction of the base plate 31b as shown in FIG. 4. The track rails 32a are provided respectively on both end sides of the platform 31 as shown in FIG. 5.

The moving block 32b has a generally inverted-U cross-sectional shape and is attached to the track rail 32a via a plurality of balls, not shown. The moving block 32b straddles the track rail 32a so as to freely reciprocate on the track rail 32a. The attachment unit 32c is shaped like a flat plate and provided on the upper surface of the moving block 32b.

The driving unit 32d includes a ball screw portion 32e, a nut portion 32f, and a control motor 32g. The ball screw portion 32e extends in the longitudinal direction of the base plate 31b as shown in FIG. 4. Both end portions of the ball screw portion 32e are rotatably attached to the platform 31.

The nut portion 32f is provided on the lower surface of the attachment unit 32c as shown in FIG. 5 so as to be screwed with the ball screw portion 32e. The control motor 32g such as a servo motor is connected to one end of the ball screw portion 32e.

Thus, when the ball screw portion 32e is rotated by the control motor 32g, the attachment unit 32c is reciprocated in the direction of arrow X shown in FIG. 4.

The mounting section 33 includes an electrostatic chuck or vacuum chuck, not shown, so that a wafer 10 can be mounted and held on the mounting surface of the mounting section 33. Furthermore, the mounting section 33 includes a heating portion 33a such as a heater so that the bonding material attached via a wafer 10 held thereon can be heated. Here, the heating portion 33a only needs to be able to heat the bonding material. For instance, the heating portion 33a may perform heating by circulating a heat medium. Alternatively, the heating portion 33a can be spaced from the mounting section 33. For instance, an infrared heater can be provided at a position from which the wafer 10 held on the mounting section 33 can be irradiated. That is, the heating portion only needs to be able to heat the bonding material attached in a film form onto the wafer 10.

The support 34 has a generally inverted-U shape and is provided upright from above the base plate 31b so as to straddle the pair of track rails 32a. An attachment unit 34b is projected from the bridging portion 34a of the support 34. The jetting section 35 and the vapor pressure controller 36 are attached to this attachment unit 34b.

The jetting section 35 jets a bonding material containing a resin and a solvent toward the wafer 10. The jetting section 35 illustrated in FIGS. 4 to 6 jets a bonding material toward the wafer 10 by the ink jet method. There are ink jet methods of the "thermal type" in which air bubbles are generated by heating and a liquid is jetted by using the film boiling phenomenon, and of the "piezoelectric type" in which a liquid is jetted by using the bending deformation of a piezoelectric element. Either type may be used in the jetting section 35. The jetting section 35 can be based on a known ink jet head for jetting a liquid by the ink jet method. Hence, the description of the detailed configuration thereof is omitted.

As shown in FIG. 5, a reservoir 35a is connected to the jetting section 35 via a piping 35b so that the bonding material can be supplied to the jetting section 35. The reservoir 35a reserves a bonding material with adjusted viscosity. Here, as described above, to suppress clogging of the jetting nozzle, the viscosity of the bonding material at 25° C. is preferably made lower. The supply of the bonding material from the reservoir 35a to the jetting section 35 may be based on the elevation head, or may be based on liquid feeding means such as a pump.

Furthermore, a controller, not shown, for controlling the jetting timing and the jetting amount from the jetting section 35 is provided. For instance, in the case of the jetting section 35 of the "piezoelectric type", the voltage applied to the piezoelectric element is changed to control the amount of actuation of the piezoelectric element so as to control the size of the droplet of the bonding material, i.e., the jetting amount of the bonding material, jetted from the jetting nozzle opposed to each piezoelectric element. Thus, the thickness of the bonding material attached in a film form can be set to approximately 1 µm (micrometer) or less.

Furthermore, an ejector, not shown, for ejecting the excess bonding material can be provided.

As shown in FIG. 6, the jetting sections 35 are provided on both surfaces of the attachment unit 34b. The jetting sections 35 are staggered so that the pitch P1 of the jetting nozzles between the adjacent jetting sections 35 is generally equal to the pitch P2 of the jetting nozzles in the jetting section 35.

The vapor pressure controller 36 is located near the jetting section 35 for jetting the bonding material. The vapor pressure controllers 36 are provided so as to sandwich the jetting sections 35 arranged in two rows. The vapor pressure controllers 36 are provided on both surfaces of the attachment unit 34b via the support 36a.

The vapor pressure controller 36 decreases the vapor pressure of the solvent in the atmosphere faced with the bonding material attached in a film form onto the wafer 10.

Means for decreasing the vapor pressure of the solvent in the atmosphere faced with the bonding material can be, e.g., means for removing the vapor of the solvent in the atmosphere faced with the bonding material to decrease the vapor pressure of the solvent. For instance, the vapor of the solvent can be removed by producing airflow in the atmosphere faced with the bonding material. Alternatively, the vapor of the solvent can be removed by changing the pressure in the atmosphere faced with the bonding material. Such means can be, e.g., air blowing means such as a fan, or means for pushing away the vapor of the solvent, such as injecting a pressurized gas with flow rate regulation. Alternatively, the vapor of the solvent can be pulled away by exhaust means such as a ventilating fan and an exhaust pump.

Here, in the ink jet method, the viscosity of the bonding material needs to be decreased to prevent clogging of the jetting nozzle. Because the bonding material with low viscosity behaves as liquid, the end portion of the attached bonding material tends to rise. Increasing the viscosity of this bonding material after attachment to the semiconductor element can be achieved by effectively volatilizing the solvent of the bonding material. Here, the solvent of the bonding material may be efficiently removed by increasing the temperature of the mounting section 33. However, this alone is not sufficient in some cases. More specifically, the volatilized solvent is saturated in the atmosphere faced with the bonding material, and the evaporation rate of the solvent of the bonding material remains low even if the temperature of the mounting section 33 is increased. Here, excessively increasing the temperature of the mounting section 33 causes a problem of thermal damage to the semiconductor element. Thus, by removing the vapor of the solvent in the atmosphere faced with the bonding material, the solvent of the bonding material is effectively evaporated to increase the viscosity of the bonding material. Consequently, the rise of the bonding material in the end portion can be prevented.

Furthermore, if an excessive airflow is produced in the atmosphere faced with the bonding material, there is a danger that the temperature of the heated bonding material decreases. Thus, the means for producing airflow is preferably capable of suppressing the temperature decrease of the heated bonding material. Such means can be, e.g., a hot air fan or a gas injector equipped with heating means.

The vapor pressure controller 36 is provided near the jetting section 35. Thus, the vapor of the solvent generated from the attached bonding material can be efficiently removed. Consequently, the temperature decrease of the heated bonding material can be suppressed. Furthermore, instead of a hot air fan, a fan for circulating the normal temperature air can be used. This can reduce the power consumption. Furthermore, the vapor pressure controllers 36 are arranged so as to sandwich the jetting sections 35. Hence, the vapor of the solvent generated from the attached bonding material can be excluded with minimum airflow.

Furthermore, as shown in FIG. 5, a controller 36b for controlling the operation of the vapor pressure controller 36 is provided. The vapor pressure of the solvent in the atmosphere faced with the bonding material varies with the type of the solvent. Hence, by the controller 36b, the amount of air blowing, the amount of injection, and the amount of gas exhaust are adjusted as necessary. Here, the relation of the vapor pressure of the solvent in the atmosphere faced with the bonding material to the amount of air blowing, the amount of injection, and the amount of gas exhaust can be previously determined by experiments. Based on this relation, the amount of air blowing, the amount of injection, and the amount of gas exhaust can be controlled.

In the example illustrated in FIGS. 4 to 6, two vapor pressure controllers 36 are provided so as to sandwich the jetting sections 35. However, it is also possible to provide one of the vapor pressure controllers 36, or three or more vapor pressure controllers 36. Furthermore, the vapor pressure controller 36 can be spaced from the jetting section 35. For instance, the vapor pressure controller 36 can be provided in the range where the wafer 10 is moved by the moving section 32. Consequently, the vapor of the solvent generated from the attached bonding material can be effectively removed. Furthermore, at least the range where the wafer 10 is moved by the moving section 32 can be enclosed in a chamber so as to decrease the vapor pressure of the solvent in the chamber. For instance, the vapor pressure of the solvent in the chamber can be decreased by an exhaust unit such as an exhaust pump or an air blowing unit such as a fan provided in the chamber.

In the foregoing example, the position of the wafer 10 is changed by the moving section 32. However, it is also possible to change the position of the jetting section 35 and the vapor pressure controller 36. That is, it is only necessary to change the relative position of the wafer 10 with respect to the jetting section 35 and the vapor pressure controller 36. Furthermore, the moving section 32 can be an X-Y table, conveyor, or industrial robot. Here, in the case where there is no need to change the relative position of the wafer 10 with respect to the jetting section 35 and the vapor pressure controller 36 (e.g., in the case where the jetting sections 35 and the vapor pressure controllers 36 are provided in a plurality of rows), there is no need to provide the moving section 32.

In the foregoing example, a plurality of jetting sections 35 are provided in two rows. However, this embodiment is not limited thereto. The jetting sections 35 can be provided in one row, or in three or more rows. Furthermore, the number of jetting sections 35 is also not limited to the foregoing example. For instance, the number of jetting sections 35 can be suitably changed in view of ease of manufacturing and maintenance of the jetting sections 35.

Next, the operation of the semiconductor manufacturing apparatus 30 is illustrated.

First, a wafer 10 is carried in by a transfer means, not shown, and mounted and held on the mounting surface of the mounting section 33. Here, the wafer 10 is mounted and held so that the rear surface of the wafer 10 faces the jetting section 35. The front surface of the wafer 10 includes a circuit pattern formed in the so-called upstream process.

Next, the position of the wafer 10 is moved by the moving section 32 so that the wafer 10 is located below the jetting section 35.

Next, a bonding material in droplets is jetted from the jetting section 35 toward the wafer 10. Then, the position of the wafer 10 is moved by the moving section 32 so that the bonding material is attached in a film form onto the wafer 10.

At this time, the attached bonding material is heated via the wafer 10 by the heating portion 33a provided in the mounting section 33. Furthermore, the vapor pressure of the solvent in the atmosphere faced with the bonding material attached to the wafer 10 is decreased by the vapor pressure controller 36. Here, preferably, the vapor pressure of the solvent in the atmosphere faced with the bonding material is made lower than the saturated vapor pressure.

Thus, the bonding material attached in a film form is converted to the B-stage to form a bonding layer. To thicken the thickness of the bonding layer, the aforementioned procedure can be repeated to form a bonding layer as stacked layers.

The process conditions such as the composition of the bonding material, the viscosity of the bonding material, the viscosity of the bonding layer (the degree of curing of the bonding layer), the heating temperature, the heating time, and the amount of air blowing are similar to those described above, and hence the description thereof is omitted.

Thus, by dicing the wafer 10 with the bonding layer formed on the rear surface, a semiconductor element with the bonding layer formed on the rear surface can be obtained. The semiconductor element with the bonding layer formed on the rear surface is bonded to a base material via the bonding layer in the mounting, and subjected to bonding, sealing, and inspection for functionality and reliability. To this end, the semiconductor manufacturing apparatus 30 can also be linked to a mounting apparatus, bonding apparatus, sealing apparatus, and inspection apparatus via transfer means.

In the foregoing example, the wafer 10 with the bonding layer formed on the rear surface is diced to obtain a semiconductor element with the bonding layer formed on the rear surface. However, this embodiment is not limited thereto. For instance, a semiconductor element with the bonding layer formed on the rear surface can be obtained also by performing the so-called pre-dicing and forming a bonding layer on the rear surface of the diced wafer 10.

In the semiconductor manufacturing apparatus 30 according to this embodiment, when the bonding material is attached to the rear surface of the semiconductor element, the bonding material can be heated to evaporate the solvent, and the vapor pressure of the solvent in the atmosphere faced with the bonding material can be decreased. This can facilitate evaporation of the solvent and suppress the formation of a thin film 100 having a protrusion 100a on the rear surface of the semiconductor element 20 located in the peripheral portion of the wafer 10. That is, a flattened thin film 100 can be formed. By subsequent conversion to the B-stage, a flattened bonding layer 100b can be formed on the rear surface of the semiconductor element. Changes in the composition and use condition of the bonding material can be rapidly and easily responded by suitably changing the heating temperature, the heating time, the amount of air blowing, the amount of injection, and the amount of gas exhaust. That is, complication of the process for forming the bonding layer can be suppressed, and the surface of the bonding layer can be flattened. Consequently, the generation of a void 102 can be suppressed when the semiconductor element is bonded to a base material via the bonding layer.

Furthermore, the thickness of the bonding material attached in a film form can be set to approximately 1 μm (micrometer) or less. Thus, the formation of the protrusion 100c can be further suppressed when the bonding material is converted to the B-stage. Furthermore, an additive having the action of suppressing the surface tension difference can be added to the bonding material. Then, the formation of the protrusion 100c in converting the bonding material to the B-stage can be further suppressed.

The embodiments described above can realize a method for manufacturing a semiconductor device and a semiconductor manufacturing apparatus capable of flattening the front surface of the bonding layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For instance, the shape, dimension, number, and layout of the components of the semiconductor manufacturing apparatus 30 are not limited to those illustrated, but can be suitably modified.

The invention claimed is:

1. A semiconductor manufacturing apparatus comprising:
   a mounting section configured to mount a wafer;
   a jetting section configured to jet a bonding material containing a resin and a solvent toward the wafer;
   a heating section configured to heat the bonding material attached in a film form onto the wafer; and
   a vapor pressure controller configured to decrease vapor pressure of the solvent in an atmosphere faced with the bonding material attached in the film form onto the wafer.

2. The apparatus according to claim 1, wherein the vapor pressure controller is located near the jetting section configured to jet the bonding material.

3. The apparatus according to claim 1, wherein the vapor pressure controller is located so as to sandwich the jetting section.

4. The apparatus according to claim 3, wherein the vapor pressure controller produces airflow in the atmosphere faced with the bonding material.

5. The apparatus according to claim 3, wherein the vapor pressure controller changes pressure in the atmosphere faced with the bonding material.

6. The apparatus according to claim 1, wherein the vapor pressure controller removes the vapor of the solvent in the atmosphere faced with the bonding material.

7. The apparatus according to claim 1, wherein the vapor pressure controller is a fan.

8. The apparatus according to claim 1, wherein the jetting section jets the bonding material toward the wafer by an ink jet method.

9. The apparatus according to claim 1, wherein the jetting section jets the bonding material toward the wafer so that thickness of the bonding material attached in the film form is 1 μm or less.

* * * * *